United States Patent
Chen et al.

(10) Patent No.: US 9,985,110 B2
(45) Date of Patent: May 29, 2018

(54) SEMICONDUCTOR PROCESS

(71) Applicant: United Microelectronics Corp., Hsinchu (TW)

(72) Inventors: Pin-Hong Chen, Yunlin County (TW); Kuo-Chih Lai, Tainan (TW); Chia-Chang Hsu, Kaohsiung (TW); Chun-Chieh Chiu, Keelung (TW); Li-Han Chen, Tainan (TW); Min-Chuan Tsai, New Taipei (TW); Kuo-Chin Hung, Changhua County (TW); Wei-Chuan Tsai, Changhua County (TW); Hsin-Fu Huang, Tainan (TW); Chi-Mao Hsu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/656,778

(22) Filed: Jul. 21, 2017

(65) Prior Publication Data
US 2017/0323950 A1 Nov. 9, 2017

Related U.S. Application Data

(63) Continuation of application No. 14/924,532, filed on Oct. 27, 2015, now Pat. No. 9,755,047.

(51) Int. Cl.
| | | |
|---|---|---|
| *H01L 27/088* | (2006.01) | |
| *H01L 29/66* | (2006.01) | |
| *H01L 29/45* | (2006.01) | |
| *H01L 29/267* | (2006.01) | |
| *H01L 29/78* | (2006.01) | |
| *H01L 21/285* | (2006.01) | |

(52) U.S. Cl.
CPC ...... *H01L 29/665* (2013.01); *H01L 21/28518* (2013.01); *H01L 29/267* (2013.01); *H01L 29/45* (2013.01); *H01L 29/785* (2013.01); *H01L 29/7845* (2013.01)

(58) Field of Classification Search
CPC . H01L 21/28518; H01L 29/267; H01L 29/45; H01L 29/665; H01L 29/7845; H01L 29/785
USPC ............ 257/401, 44, 288, 757; 1/1; 420/418
See application file for complete search history.

(56) References Cited

U.S. PATENT DOCUMENTS

| | | | | |
|---|---|---|---|---|
| 5,828,131 A | * | 10/1998 | Cabral, Jr. | ............... C30B 1/02 257/757 |
| 5,989,988 A | * | 11/1999 | Iinuma | ............. H01L 21/28052 257/E21.165 |
| 6,008,124 A | * | 12/1999 | Sekiguchi | ......... H01L 21/28052 257/E21.165 |
| 6,011,272 A | * | 1/2000 | Omid-Zohoor | ... H01L 21/28518 257/44 |
| 8,659,032 B2 | | 2/2014 | Chao et al. | |
| 2003/0224597 A1 | * | 12/2003 | Hu | .................... H01L 21/28518 438/652 |
| 2006/0237766 A1 | * | 10/2006 | Ahn | .................. H01L 21/02063 257/314 |

(Continued)

*Primary Examiner* — Mohammed Shamsuzzaman
(74) *Attorney, Agent, or Firm* — J.C. Patents

(57) ABSTRACT

A semiconductor process is described. A silicon-phosphorus (SiP) epitaxial layer is formed serving as a source/drain (S/D) region. A crystalline metal silicide layer is formed directly on the SiP epitaxial layer and thus prevents oxidation of the SiP epitaxial layer. A contact plug is formed over the crystalline metal silicide layer.

9 Claims, 1 Drawing Sheet

(56) References Cited

U.S. PATENT DOCUMENTS

| | | |
|---|---|---|
| 2014/0167264 A1 | 6/2014 | Besser et al. |
| 2015/0099340 A1 | 4/2015 | Yu et al. |
| 2015/0118099 A1* | 4/2015 | Frommeyer ............ C22C 14/00 420/418 |
| 2015/0228745 A1* | 8/2015 | Breil ..................... H01L 29/456 257/288 |
| 2016/0233164 A1* | 8/2016 | Choi ................... H01L 27/0924 |

* cited by examiner

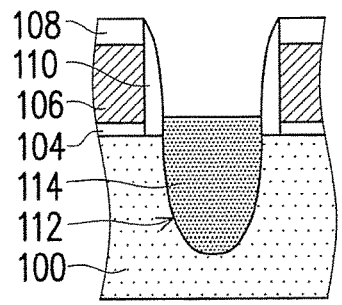
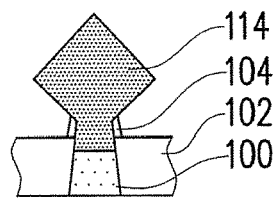
FIG. 1A  FIG. 1B
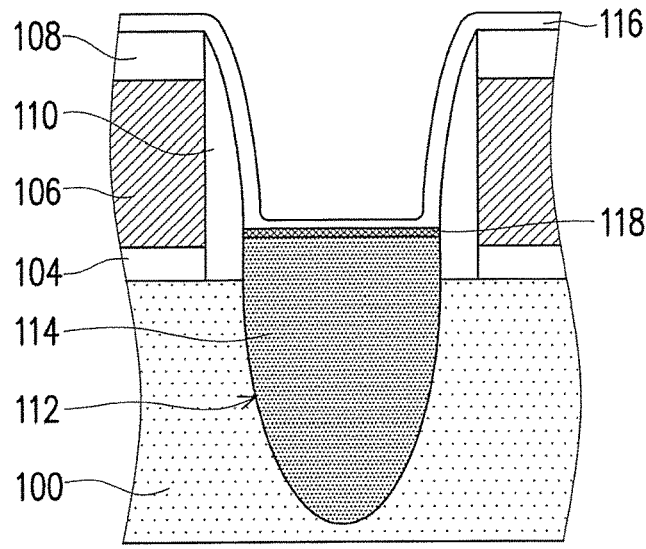
FIG. 2
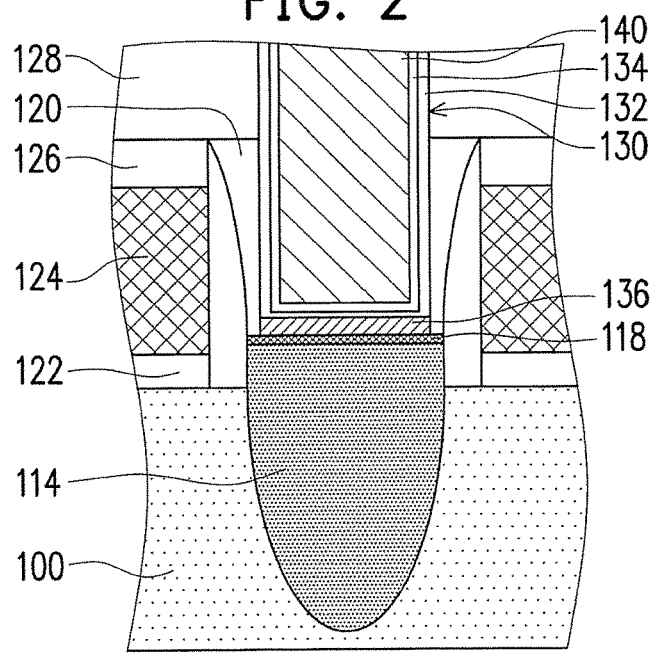
FIG. 3

SEMICONDUCTOR PROCESS

CROSS-REFERENCE TO RELATED APPLICATION

This application is a divisional application of and claims the priority benefit of U.S. application Ser. No. 14/924,532, filed on Oct. 27, 2015, now allowed. The entirety of the above-mentioned patent application is hereby incorporated by reference herein and made a part of this specification.

BACKGROUND OF THE INVENTION

Field of Invention

This invention relates to a semiconductor process, and particularly relates to a semiconductor process capable of reducing contact resistance, and a semiconductor device that can be formed with the semiconductor process.

Description of Related Art

In the strained silicon technology for MOS transistors, a source/drain region of an NMOS transistor usually includes a strained silicon-phosphorus (SiP) epitaxial layer. A metal silicide is usually formed over the SiP layer to reduce the contact resistance.

In a conventional process, the metal silicide is not formed until a contact hole is formed over and exposing the SiP epitaxial layer. Since SiP is easily oxidized during the period, native oxide is easily formed on the SiP epitaxial layer separating the same from the metal silicide, so that the contact resistance is raised.

SUMMARY OF THE INVENTION

In view of the foregoing, this invention provides a semiconductor process capable of reducing contact resistance.

This invention also provides a semiconductor device that can be formed with the semiconductor process of this invention.

The semiconductor process of this invention is described below. A SiP epitaxial layer is formed serving as a source/drain region. A crystalline metal silicide layer is formed directly on the SiP epitaxial layer and thus prevents oxidation of the SiP epitaxial layer. A contact plug is formed over the crystalline metal silicide layer.

The semiconductor device of this invention includes a SiP epitaxial layer serving as a source/drain region, a first metal silicide layer over the SiP epitaxial layer, a second metal silicide layer over the first metal silicide layer, and a contact plug over the second metal silicide layer.

In an embodiment of the semiconductor device, the first metal silicide layer comprises a crystalline metal silicide layer, and the second metal silicide layer comprises an amorphous metal silicide layer.

Because a crystalline metal silicide layer is formed on the SiP epitaxial layer to prevent oxidation, native oxide is not formed on the SiP epitaxial layer, so the contact resistance is lowered and a knob for Re-tuning between NMOS and PMOS is provided.

In order to make the aforementioned and other objects, features and advantages of the present invention comprehensible, a preferred embodiment accompanied with figures is described in detail below.

BRIEF DESCRIPTION OF THE DRAWINGS

FIGS. 1A, 2 and 3 illustrate, in a cross-sectional view, a semiconductor process according to an embodiment of this invention, and FIG. 1B illustrates, in a perpendicular cross-sectional view, the structure as shown in FIG. 1A.

DESCRIPTION OF EMBODIMENTS

This invention will be further explained with the following embodiment and the accompanying drawings, which are not intended to restrict the scope of this invention. For example, although the device as illustrated in the embodiment is a metal-gate fin device, this invention can also be applied to another kind of fin device or 3D device or even a planar device of which the process includes forming a SiP epitaxial layer.

FIGS. 1A, 2 and 3 illustrate, in a cross-sectional view, a semiconductor process according to an embodiment of this invention, and FIG. 1B illustrates, in a perpendicular cross-sectional view, the structure as shown in FIG. 1A.

Referring to FIG. 1A/1B, silicon fin structures 100 for N-FinFETs are formed, an isolation layer 102 is formed filling in between the fin structures 100, a sacrifice gate dielectric 104, a sacrifice gate layer 106 and a sacrifice cap layer 108 are formed and patterned such that the patterned sacrifice gate layer 106 crosses over the fin structure 100, a spacer 110 is formed on the sidewall of the patterned sacrifice gate layer 106, a recess 112 is formed in the fin structure 100 between the spacers 110, and then a SiP epitaxial layer 114 is formed based on the recessed fin structure 100, usually with in-situ N-doping. The SiP layer 114 may have a diamond-shaped head in the cross-sectional view showing the "fin" shape of the fin structure 100, as shown in FIG. 1B.

After the SiP epitaxial layer 114 is grown, a post-SiP cleaning process is usually performed, possibly using SC1 (or APM as Ammonia/Peroxide Mix) for surface clean.

Referring to FIG. 2, a metal layer 116 is formed in contact with the SiP epitaxial layer 114. The metal layer 116 may include Ti/TiN, cobalt (Co), or nickel (Ni). A first metal silicidation reaction is performed by heating to form a crystalline metal silicide layer 118 directly on the SiP epitaxial layer 114. The heating is possibly carried out by a rapid thermal process (RTP). The first metal silicidation reaction is possibly conducted at a temperature between 700° C. and 800° C. When the metal layer 116 includes Ti/TiN, the crystalline metal silicide layer 118 includes C54 TiSi. The thickness of the crystalline metal silicide layer 118 possibly ranges from 5 nm to 15 nm.

After that, the remaining metal layer 116 or the unreacted metal is removed (not shown), leaving the crystalline metal silicide layer 118. This process is usually called a stripping process.

Referring to FIG. 3, after the gap between the sacrifice gates 106 is filled with an insulating layer 120, a replacement metal gate (RMG) process is conducted. In the RMG process, the sacrifice cap layer 108, the sacrifice gate dielectric 104 and the sacrifice gate layer 106 are removed leaving an opening, and then a gate dielectric layer 122, a metal gate 124 and a cap layer 126 are formed in the opening.

In addition, after the remaining metal layer 116 is removed but before the RMG process, SiGe epitaxial S/D regions may be formed for PMOS transistors (not shown).

Referring to FIG. 3 again, another insulating layer 128 is then formed over the resulting structure, a contact hole 130 is formed through the insulating layers 128 and 120. A barrier metal layer is then formed in the contact hole 130, possibly including a first metal layer 132 including Ti or Ni/Co, and a second metal layer 134 including TiN or WN.

Accordingly, the barrier metal layer may possibly include Ti/TiN, Ni/Co/TiN, Ti/WN, or Ni/Co/WN.

A second metal silicidation reaction between the barrier metal layer (132) and the SiP epitaxial layer 114 is performed by heating, by which silicon atoms pass through the crystalline metal silicide layer 118 for reaction, to form an amorphous metal silicide layer 136 on the crystalline metal silicide layer 118. When the first metal layer 132 includes titanium, the amorphous metal silicide layer 136 includes α-TiSi. When the first metal layer 132 including Ni/Co, the amorphous metal silicide layer 136 contains nickel and cobalt. The heating is possibly carried out by a rapid thermal process (RTP). The second metal silicidation reaction is possibly conducted at a temperature between 550° C. and 600° C. The thickness of the amorphous metal silicide layer 136 may possibly range from 30 nm to 50 nm.

In a particular embodiment, the metal layer 116 and the barrier layer 132+134 both include Ti/TiN, the crystalline metal silicide layer 118 includes C54 TiSi, and the amorphous metal silicide layer 136 includes α-TiSi.

Thereafter, the contact hole 130 is filled with a metal material to form a contact plug 140. The metal material of the contact plug 140 may include tungsten (W), cobalt, copper (Cu) or aluminum (Al).

Because a crystalline metal silicide layer is formed on the SiP epitaxial layer to prevent oxidation, native oxide is not formed on the SiP epitaxial layer, so the contact resistance is lowered and a knob for Rc-tuning between NMOS and PMOS is provided.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor process, comprising:
   forming a silicon-phosphorus (SiP) epitaxial layer serving as a source/drain region of a diamond shape silicon fin structure;
   forming, directly on the SiP epitaxial layer, a crystalline metal silicide layer that prevents oxidation of the SiP epitaxial layer; and
   forming a contact plug over the crystalline metal silicide layer, comprising forming a contact hole over the crystalline metal silicide layer;
   forming a barrier metal layer in the contact hole including a first metal layer and a second metal layer on the first metal layer;
   performing a metal silicidation reaction between the first metal layer of the barrier metal layer and the SiP epitaxial layer by heating by which silicon atoms from the SiP epitaxial layer pass through the crystalline metal silicide layer for reaction with the first metal layer to form an amorphous metal silicide layer on the crystalline metal silicide layer;
   filling the contact hole with a metal material; and
   wherein a thickness of the crystalline metal silicide layer is between 5 nm and 15 nm and a thickness of the amorphous metal silicide layer is between 30 nm and 50 nm.

2. The semiconductor process of claim 1, wherein forming the crystalline metal silicide layer comprises:
   forming a metal layer in contact with the SiP epitaxial layer;
   performing another metal silicidation reaction by heating; and
   removing the remaining metal layer.

3. The semiconductor process of claim 2, wherein the metal layer comprises Ti/TiN, cobalt, or nickel.

4. The semiconductor process of claim 3, wherein the metal layer comprises Ti/TiN, and the crystalline metal silicide layer comprises C54 TiSi.

5. The semiconductor process of claim 2, wherein the another metal silicidation reaction is conducted at a temperature between 700° C. and 800° C.

6. The semiconductor process of claim 1, wherein the barrier metal layer comprises Ti/TiN, Ni/Co/TiN, Ti/WN, or Ni/Co/WN.

7. The semiconductor process of claim 6, wherein the barrier metal layer contains titanium, and the amorphous metal silicide layer comprises a-TiSi.

8. The semiconductor process of claim 1, wherein the second metal silicidation reaction is conducted at a temperature between 550° C. and 600° C.

9. The semiconductor process of claim 1, wherein the metal material comprises tungsten, cobalt, copper or aluminum.

* * * * *